(12) United States Patent
Shields et al.

(10) Patent No.: US 6,551,923 B1
(45) Date of Patent: Apr. 22, 2003

(54) DUAL WIDTH CONTACT FOR CHARGE GAIN REDUCTION

(75) Inventors: Jeffrey A. Shields, Sunnyvale, CA (US); Bharath Rangarajan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/430,845

(22) Filed: Nov. 1, 1999

(51) Int. Cl.[7] .......................................... H01L 21/4763
(52) U.S. Cl. ..................... 438/637; 438/597; 438/637; 438/638; 438/640; 438/523; 438/533; 257/296; 257/300
(58) Field of Search ................................ 438/597–620, 438/638, 637, 640, 201, 523–533; 257/296–306

(56) References Cited

U.S. PATENT DOCUMENTS

| | | | |
|---|---|---|---|
| 4,977,108 A | 12/1990 | Haskell | |
| 5,028,555 A | 7/1991 | Haskell | |
| 5,081,060 A | 1/1992 | Kim | |
| 5,100,838 A | 3/1992 | Dennison | |
| 5,210,047 A | 5/1993 | Woo et al. | |
| 5,275,963 A | 1/1994 | Cederbaum et al. | |
| 5,459,354 A | 10/1995 | Hara | |
| 5,512,779 A | 4/1996 | Noda | |

(List continued on next page.)

FOREIGN PATENT DOCUMENTS

| | | | |
|---|---|---|---|
| EP | 854508 A2 | 12/1997 | |
| EP | 0326293 A1 | 1/1998 | |
| GB | 2268329 A | 1/1993 | |
| TW | 299482 | 8/1996 | ........... H01L/21/70 |

OTHER PUBLICATIONS

Wolf, S., "Silicaon Processing for the VLSI Era", vol. 2, Lattice Press, Sunset Beach, CA., 1990. (2 pgs.).

(List continued on next page.)

*Primary Examiner*—Matthew Smith
*Assistant Examiner*—Granvill D Lee, Jr.
(74) *Attorney, Agent, or Firm*—Foley & Lardner

(57) ABSTRACT

A method of forming a contact in an integrated circuit is disclosed herein. The method includes providing a first insulating layer over a semiconductor substrate including first and second gate structures, providing an etch stop layer over the first insulating layer, providing a second insulating layer over the etch stop layer, creating a first aperture in the second insulating layer between the first and second gate structures, creating a second aperture in the first insulating layer below the first aperture, and filling the first and second apertures with a conductive material to form the contact. The first aperture has a first aperture width and extends to the etch stop layer. The second aperture has a second aperture width which is less than the first aperture width.

20 Claims, 4 Drawing Sheets

U.S. PATENT DOCUMENTS

| | | | |
|---|---|---|---|
| 5,646,063 A | | 7/1997 | Mehta et al. |
| 5,652,182 A | | 7/1997 | Cleeves |
| 5,668,052 A | | 9/1997 | Matsumoto et al. |
| 5,700,349 A | * | 12/1997 | Tsukamoto et al. ......... 156/657 |
| 5,792,684 A | | 8/1998 | Lee et al. |
| 5,795,823 A | | 8/1998 | Avanzino et al. |
| 5,801,094 A | * | 9/1998 | Yew et al. .................. 438/624 |
| 5,807,779 A | | 9/1998 | Liaw |
| 5,869,395 A | * | 2/1999 | Yim .......................... 438/637 |
| 5,885,865 A | | 3/1999 | Liang et al. |
| 5,899,742 A | * | 5/1999 | Sun ........................... 438/682 |
| 5,907,781 A | * | 5/1999 | Chen et al. ................. 438/303 |
| 5,960,318 A | | 9/1999 | Peschke et al. |
| 6,008,114 A | * | 12/1999 | Li .............................. 438/618 |
| 6,027,966 A | | 2/2000 | Saenger et al. |
| 6,033,980 A | | 3/2000 | Liuo et al. |
| 6,150,223 A | * | 11/2000 | Chern et al. ................ 438/303 |
| 6,156,636 A | * | 12/2000 | Yeom et al. ................ 438/618 |
| 6,284,642 B1 | * | 9/2001 | Liu et al. .................... 438/622 |
| 6,287,751 B2 | * | 9/2001 | Lee et al. ................... 430/317 |
| 6,441,418 B1 | * | 8/2002 | Shields et al. .............. 257/296 |

OTHER PUBLICATIONS

Ishigaki, Y., et al. "Low Parasitic Resistance Technologies with NES–SAC and SWT–CVD Process" 1994 IEEE Symposium on VLSI Technology Digest of Technical Papers, Jun. 1994, pp. 99–100.

Kuesters, K, et al. "Self–Aligned Bitline Contact for 4Mbit DRAM" Proceedings of the 1987 Symposium on ULSI Science and Technology, pp. 640–649.

Kaanta, C., et al. "Dual Damascene: A ULSI Wiring Technology", Jun. 11–12 1991 VMIC Conference, IEEE.

IBM Technical Disclosure Bulletin, vol. 36 No. 11, Nov. 1993, "Damascene: Optimized Etch Stop Structure and Method", p. 649.

Vollmer, B. et al. "Recent Advances in the Application of Collimated Sputtering" (PCT 206). 2194 Thin Solid Films 247 (1994), Jul., 1, No. 1, Luasanne, CH, pp. 104–111.

* cited by examiner

DUAL WIDTH CONTACT FOR CHARGE GAIN REDUCTION

CROSS REFERENCE TO RELATED APPLICATIONS

This patent application is related to U.S. application Ser. No. 09/705,941 by Rangarajan, et al., entitled "Method of Reducing Contact Size by Spacer Filling"; U.S. application Ser. No. 09/430,844 by Stephen Keetai Park et al., entitled "Flash Memory With Less Susceptibility To Floating Gate Charge Gain And Loss"; and U.S. application Ser. No. 09/430,848 by Shields, et al., entitled "Spacer Narrowed, Dual Width Contact For Charge Gain Reduction", all of which are filed on an even date herewith and assigned to the assignee of the present invention.

FIELD OF THE INVENTION

The present invention relates to integrated circuits and to methods of manufacturing integrated circuits. More particularly, the present invention relates to a method of reducing charge gain by forming a dual width contact.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS). ICs often include flash memory cells.

Flash memory cells are generally comprised of a transistor connected to a word line and a bit line. The transistor includes a gate stack comprised of a polysilicon cap, a control gate, a control gate dielectric, a floating gate, and a tunnel oxide. The polysilicon cap is disposed over the control gate, which is disposed over the control gate dielectric. The control gate dielectric is disposed over the floating gate, which is disposed over the tunnel oxide. The gate stack is located between a source and a drain. An insulative spacer abuts each side of the gate stack. The drain is connected to the bit line through a contact. The word line is connected to the control gate of the transistor. The flash memory cell stores data (e.g., a 1 or 0) in the floating gate.

Generally, the transistor is covered by a high temperature oxide and an interlevel dielectric to insulate it from subsequently formed metal layers. An aperture or hole is etched through the interlevel dielectric and the high temperature oxide. The hole is filled with a conductive material to provide connections to the transistor, to conductors, or to other circuit structures. For example, a contact can extend from the bitline through the interlevel dielectric to the drain of the transistor. In another example, a contact or conductive via can extend through the interlevel dielectric to connect to the gate stack.

As transistors disposed on integrated circuits (ICs) become smaller (e.g., transistors with gate lengths approaching 50 nm), CMOS fabrication processes must scale the dimensions of the transistors. That is, there must be proportional operational characteristics of structural elements in the ultra-small dimensions of a sophisticated transistor.

One problem associated with CMOS scaling involves spacing between gate stacks and contacts. As mentioned above, contacts are required in an IC device to provide electrical connections between layers or levels of the integrated circuit device. Semiconductor devices typically include a multitude of transistors which are coupled together in particular configurations through contacts.

Contacts are generally coupled to the source region and/or drain region of the transistors disposed on the integrated circuit. The contact is often connected to the source and drain region via a silicide layer formed in a high temperature process. The silicide layer reduces drain/source series resistance.

In conventional processes, contacts must be spaced from the gate conductor by a minimum acceptable distance (often at least one minimum lithographic feature). Charge loss and charge gain can occur when electrons travel laterally through the high temperature oxide or interlayer dielectric between the contact and the floating gate. Such charge gain and loss in the floating gate can destroy or corrupt the data stored in the memory cell.

Indeed, as integrated circuits have become more dense, distances between transistors and transistor components has become smaller. As the distance between contacts and floating gates decreases, a transistor's susceptibility to charge gain and loss is also increased. Therefore, charge gain and loss problems associated with contacts can be particularly troublesome as integrated circuits contain more transistors.

One possible solution is to increase the space on the IC layout. Nevertheless, increased contact to gate structure spacing results in lower device density. Another possible solution is to reduce the contact size by printing smaller contacts. However, printing very small contacts is a challenge to lithography. Further, small contacts cause problems associated with high contact resistance.

Thus, there is a need to reduce the charge gain and loss problem associated with spacing between the contact and the gate structure. Further, there is a need to reduce contact size while avoiding manufacturing difficulties associated with small contacts. Even further, there is a need for narrow dual width contacts which provide charge loss reduction.

SUMMARY OF THE INVENTION

One embodiment of the invention relates to a method of forming a contact in an integrated circuit. The method includes providing a first insulating layer over a semiconductor substrate including first and second gate structures, providing an etch stop layer over the first insulating layer, providing a second insulating layer over the etch stop layer, creating a first aperture in the second insulating layer between the first and second gate structures, creating a second aperture in the first insulating layer below the first aperture, and filling the first and second apertures with a conductive material to form the contact. The first aperture has a first aperture width and extends to the etch stop layer. The second aperture has a second aperture width which is less than the first aperture width.

Another embodiment of the invention relates to a method of forming a dual width contact in an integrated circuit including gate structures and an insulating layer covering the gate structures. The method includes creating an aperture in the insulating layer extending through an etch stop layer to define a contact hole and providing a contact which fills the contact hole. The aperture has a first aperture width and a second aperture width. The second aperture width is less than the first aperture width.

Another embodiment of the invention relates to an integrated circuit. The integrated circuit includes an insulating layer. The insulating layer includes an aperture extending from the top of the insulating layer to the bottom of the insulating layer and defines a contact hole. The contact hole has a first width and a second width. A contact material fills the contact hole.

BRIEF DESCRIPTION OF THE DRAWINGS

Preferred exemplary embodiments are described below with reference to the accompanying drawings, wherein like reference numerals denote like elements, and.

DETAILED DESCRIPTION OF THE PREFERRED EMBODIMENTS

Figure 1:
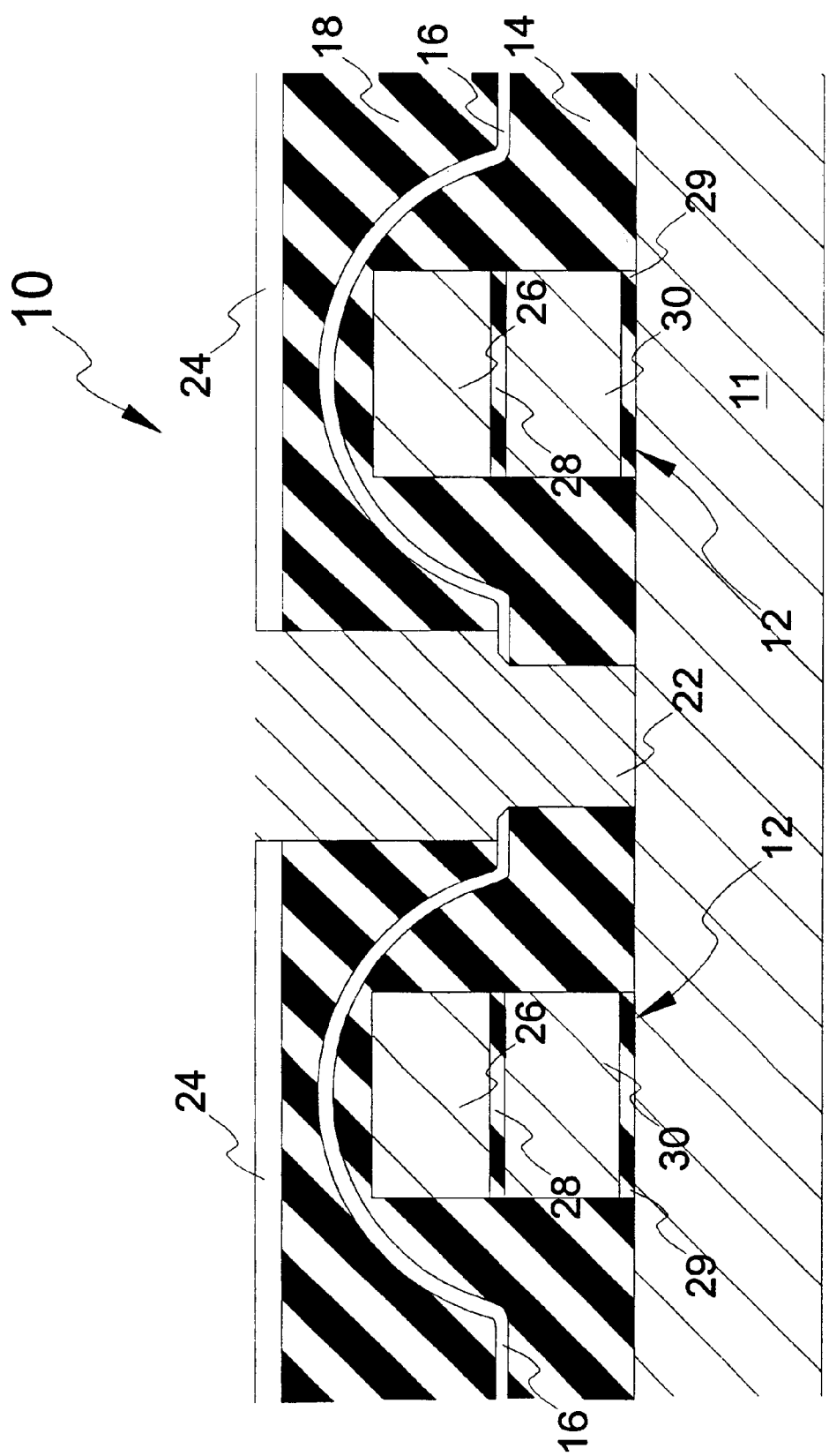
FIG. 1 is a cross-sectional view of a portion of an integrated circuit in accordance with an exemplary embodiment of the present invention.

Referring to FIG. 1, a cross-sectional view of a portion 10 of an integrated circuit is illustrated in accordance with an exemplary embodiment of the present invention. Portion 10 illustrates an interlevel dielectric (ILD) stack including polysilicon or gate structures 12, a first oxide layer 14, an etch stop layer 16, a second oxide layer 18, a contact 22, and a hardmask layer 24. Alternatively, other structures are included in the ILD stack. Portion 10 is provided on substrate 11. Substrate 11 can be silicon or any semiconducting material.

In the embodiment shown in FIG. 1, each gate structure 12 includes a control gate 26, a control gate dielectric 28, a tunnel dielectric 29, and a floating gate 30. Control gate 26 is a conductor, such as, polysilicon which provides a control or switch for gate structure 12. Control gate dielectric 28 is any of a variety of dielectric materials and isolates control gate 26 and floating gate 30. Tunnel dielectric 29 is preferably an oxide layer. Floating gate 30 is a conductor, such as, polysilicon which stores a charge representing data (e.g., a 1 or 0).

First oxide layer 14 is a layer of an insulating material that separates contact 22 from gate structure 12. First oxide layer 14 can be a single layer or a composite layer. Additionally, layer 14 can be provided over a high temperature oxide layer.

Etch stop layer 16 is a layer of material, such as, nitride ($Si_3N_4$) or SiON, which serves as a stop for typical etching processes. Etch stop layer 16 is located intermediate first oxide layer 14 and second oxide layer 18. In an exemplary embodiment of the present invention, etch stop layer 16 provides a layer at which etching stops during formation of contact 22. Preferably, the portion of etch stop layer 16 proximate contact 22 is located at the same vertical level as the top of floating gate 30.

When etch stop layer 16 is removed, its width tapers, providing a narrower opening for the formation of contact 22 adjacent to first insulating layer 14. As such, contact 22 is narrower where contact 22 is closest to floating gate 30, reducing charge gain and loss effects. Alternatively, etch stop layer 16 is located at a position which is higher than the vertical level of the top of floating gate 30. Second oxide layer 18 is a layer of insulating material, such as TEOS or silane based oxide. Layer 18 can be a single layer or a composite layer.

Contact 22 is a conductive material which provides an electrical connection to source or drain regions located in substrate 11 of the integrated circuit. In an exemplary embodiment, contact 22 includes a narrow dimension at the bottom of portion 10 and a larger and easier to pattern dimension at the top of portion 10. Hardmask layer 24 is an antireflective coating used in the selective etching process.

In the exemplary embodiment shown in FIG. 1, contact 22 has a top section width of 0.35 $\mu$m and a bottom section width of 0.25–30 $\mu$m. The distance between the bottom section of contact 22 and floating gate 30 is preferably between 0.1–0.25 $\mu$m. Also, first insulating layer 14 has a preferable thickness of 500–2,000 Å proximate contact 22 and second insulating layer 18 has a preferable thickness of 4,000–10,000 Å proximate contact 22. Etch stop layer 16 has a thickness of 100–500 521 .

Figure 2:
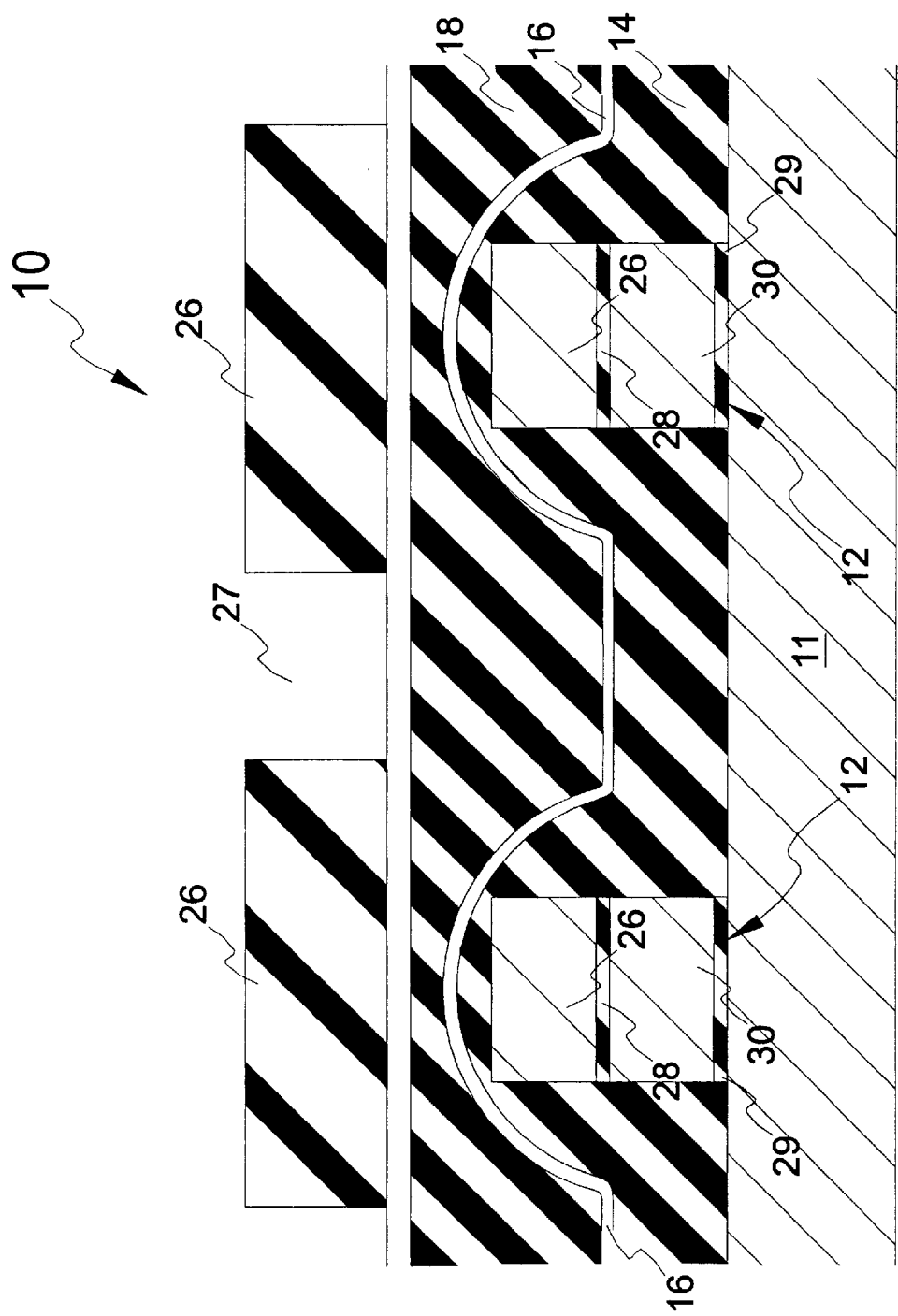
FIG. 2 is a cross-sectional view of the portion of the integrated circuit of FIG. 1, illustrating a contact hole in a resist layer in a method of forming a narrow dual width contact which provides charge gain and loss reduction in accordance with the present invention.

The method of forming portion 10 is described below with reference to FIGS. 1–14. The method advantageously forms portion 10 including a narrow dual width contact which provides for charge loss and gain reduction. In FIG. 2, a cross-sectional view of portion 10 illustrates a contact hole 27 in a resist layer 26. Dry etching may be used to form contact hole 27. Alternatively, other removal processes may be used.

Figure 3:
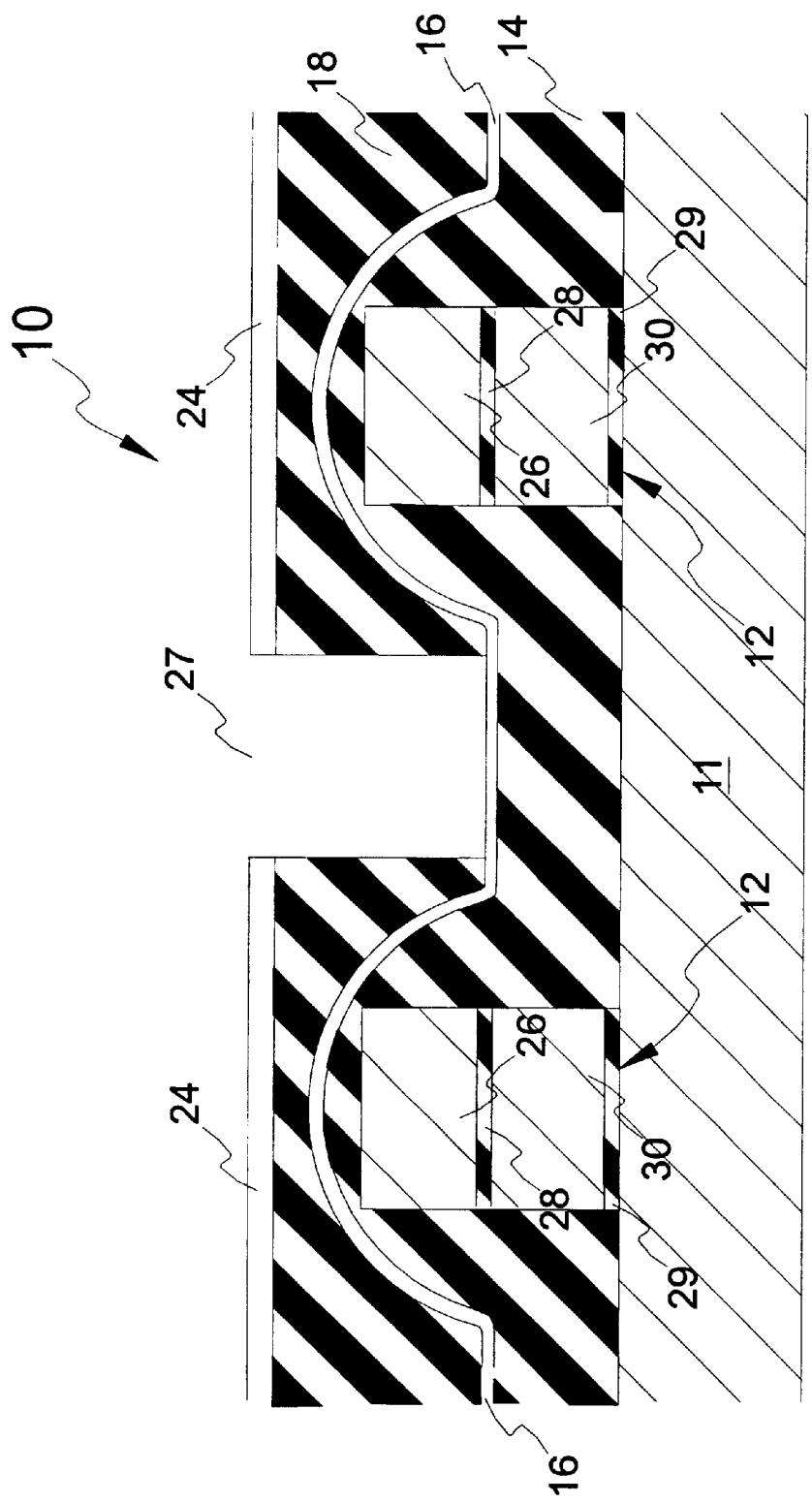
FIG. 3 is a cross-sectional view of the portion of the integrated circuit of FIG. 1, illustrating an etch step in a method of forming a narrow dual width contact which provides charge gain and loss reduction.

In FIG. 3, a cross-sectional view of portion 10 illustrates an anisotropic etch step in the method of forming a narrow dual width contact. Any of a variety of etch or removal processes can be used to extend contact hole 27 through hardmask layer 24 and second oxide layer 18 to etch stop layer 16. Preferably, contact hole 27 is etched substantially half way into the oxide, or through second oxide layer 18, stopping on etch stop layer 16.

Etch stop layer 16 is stripped and contact hole 27 is extended through first oxide layer 14 to make electrical contact with a source or drain region in the substrate. As such, the width of contact hole 27 in first oxide layer 14 is determined by the size of the removed portion of etch stop layer 16. The stripping process of etch stop layer 16 naturally results in a tapered width of the removed portion. Hence, the width of contact hole 27 at etch stop layer 16 is narrower.

Figure 4:
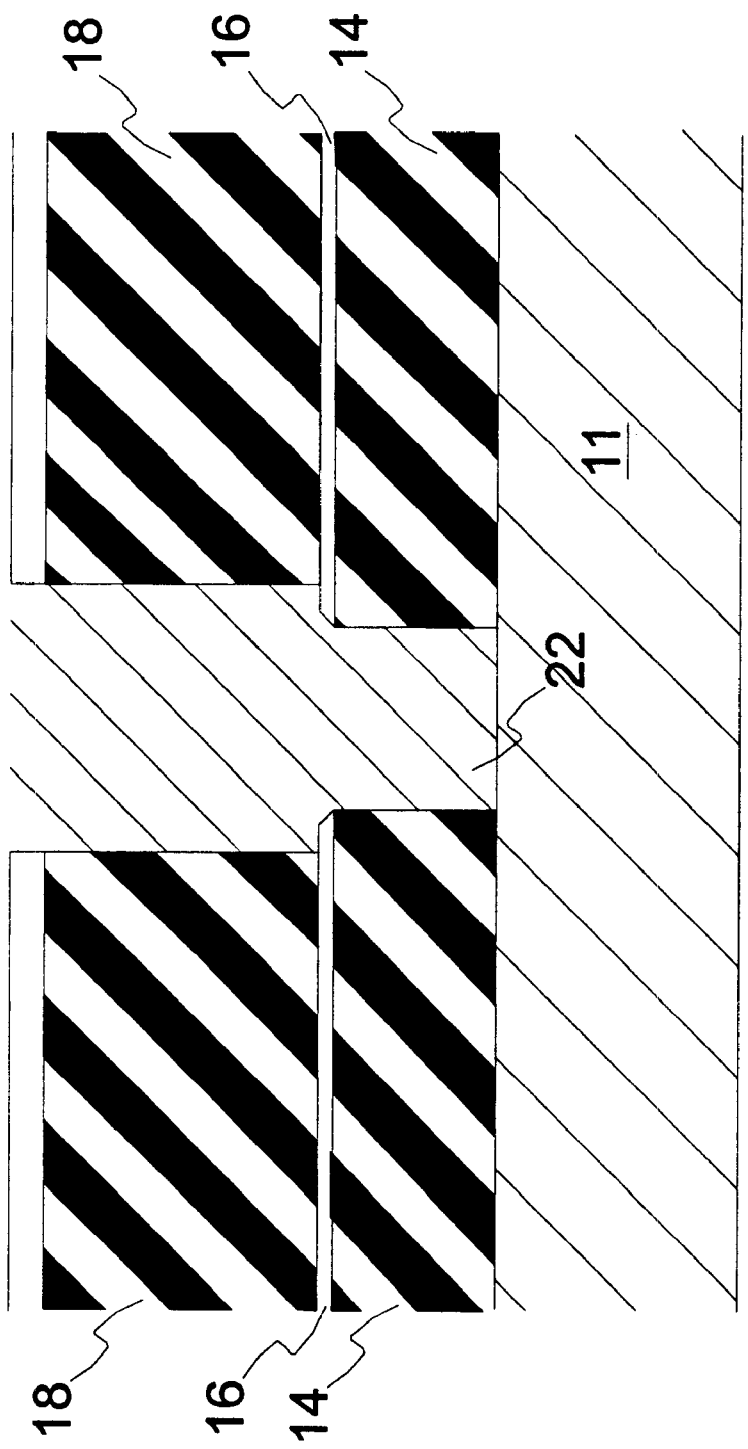
FIG. 4 is a cross-sectional view of the dual width contact in the portion of the integrated circuit of FIG. 1.

Referring now to FIG. 1, the cross-sectional view illustrates portion 10 including contact 22 filling contact hole 27. Contact 22 provides a structure for electrically coupling regions in the substrate with devices or other transistors. In FIG. 4, a cross-sectional view of dual width contact 22 in portion 10 illustrates in greater detail that contact 22 has a first width at the top of portion 10 and a second width at the bottom of portion 10. Advantageously, the described method allows contact 22 to be easily printed and etched. Further, contact 22 has a first contact width and a second contact width. The second contact width is less than the first contact width and provides a distance between the contact and the gate structures which reduces charge gain effects.

Thus, the method described with reference to FIGS. 1–4 reduces the charge-gain problem associated with spacing between contact 22 and gate structures 12. In particular, charge loss or gain between contact 22 and floating gate 30 is avoided. Further, the method reduces contact size while avoiding manufacturing difficulties associated with small contacts. Even further, the method produces narrow dual width contacts which provide charge gain reduction.

The method of forming portion 10 described with reference to FIGS. 1–4 includes two etching processes, separated by a stripping of etch stop layer 16. Alternatively, contact hole 27 is created by one etching procedure which removes portions of second insulating layer 18, etch stop layer 16, and first insulating layer 14 in one step.

While the embodiments illustrated in the FIGURES and described above are presently preferred, it should be understood that these embodiments are offered by way of example only. Other embodiments may include, for example, different techniques for removing or etching. The invention is not limited to a particular embodiment, but extends to various modifications, combinations, and permutations that nevertheless fall within the scope and spirit of the appended claims.

What is claimed is:

1. A method of forming a contact in an integrated circuit, the method comprising:
   providing a first insulating layer over a semiconductor substrate including first and second gate structures;
   providing an etch stop layer over the first insulating layer;
   providing a second insulating layer over the etch stop layer;
   creating a first aperture in the second insulating layer between the first and second gate structures, the first aperture having a first aperture width, the first aperture extending to the etch stop layer;
   creating a second aperture in the first insulating layer below the first aperture, the second aperture having a second aperture width, the second aperture width being less than the first aperture width; and
   filling the first and second apertures with a conductive material to form the contact.

2. The method of claim 1, further comprising removing a portion of the etch stop layer.

3. The method of claim 2, wherein the removed portion of the etch stop layer includes a tapered width.

4. The method of claim 2, wherein the removed portion of the etch stop layer has a top width and a bottom width, the bottom width being substantially equal to the second aperture width.

5. The method of claim 1, wherein the filling the first and second apertures with a conductive material to form the contact step comprises providing electrical connections to structures in the integrated circuit.

6. A method of forming a contact in an integrated circuit, the method comprising:
   providing a first insulating layer over a semiconductor substrate including first and second gate structures;
   providing an etch stop layer over the first insulating layer;
   providing a second insulating layer over the etch stop layer;
   creating a first aperture in the second insulating layer between the first and second gate structures, the first aperture having a first aperture width, the first aperture extending to the etch stop layer;
   creating a second aperture in the first insulating layer below the first aperture, the second aperture having a second aperture width, the second aperture width being less than the first aperture width; and
   filing the first and second apertures with a conductive material to form the contact;
   wherein the first and second gate structures include a floating gate section and the portion of the etch stop layer located proximate the contact is located at the same vertical position as the top of the floating gate section.

7. A method of forming a contact in an integrated circuit, the method comprising:
   providing a first insulating layer over a semiconductor substrate including first and second gate structures;
   providing an etch stop layer over the first insulating layer;
   providing a second insulating layer over the etch stop layer;
   creating a first aperture in the second insulating layer between the first and second gate structures, the first aperture having a first aperture width, the first aperture extending to the etch stop layer;
   creating a second aperture in the first insulating layer below the first aperture, the second aperture having a second aperture width, the second aperture width being less than the first aperture width; and
   filling the first and second apertures with a conductive material to form the contact;
   wherein the first and second gate structures include a floating gate section and the portion of the etch stop layer located proximate the contact is located above the vertical position of the top of the floating gate section.

8. A method of forming a dual width contact in an integrated circuit including gate structures and an insulating layer covering the gate structures, the method comprising:
   creating an aperture in the insulating layer extending through an etch stop layer to define a contact hole, the aperture having a first aperture width above the etch stop layer and a second aperture width below the etch stop layer, the second aperture width being less than the first aperture width; and
   providing a contact which fills the contact hole.

9. The method of claim 8, further comprising removing a portion of the etch stop layer.

10. The method of claim 9, wherein the removing a portion of the etch stop layer step comprises removing a portion of the etch stop layer approximately equal to the second aperture width.

11. The method of claim 9, wherein the etch stop layer is a nitride layer located within the insulating layer.

12. A method of forming a dual width contact in an integrated circuit including gate structures and an insulating layer covering the gate structures, the method comprising:
   creating an aperture in the insulating layer extending through an etch stop layer to define a contact hole, the aperture having a first aperture width above the etch stop layer and a second aperture width below the etch stop layer, the second aperture width being less than the first aperture width;
   removing a portion of the etch stop layer; and
   providing a contact which fills the contact hole;
   wherein the gate structures include a floating gate section and wherein the etch stop layer is located at the same vertical position as a top of the floating gate section.

13. A method of forming an integrated circuit having reduced charge gain and loss, the method comprising:
   depositing a first insulating layer over a semiconductor substrate including first and second gate structures, each of the gate structures including a control gate and a floating gate;
   depositing an etch stop layer above the first insulating layer;
   depositing a second insulating layer above the etch stop layer;
   removing a portion of the second insulating layer between the first and second gate structures to form a first contact hole, the first contact hole extending to the top of the etch stop layer and having a first width;

removing a portion of the first insulating layer between the first and second gate structures and below the first contact hole to form a second contact hole, the second contact hole extending between the bottom of the etch stop layer and the substrate and having a second width, the entire second width being less than the first width; and introducing a conductive material into the first and second contact holes to form a contact.

14. The method of claim 13, wherein the conductive material polysilicon.

15. The method of claim 13, wherein the second width is between 0.25 and 0.30 µm.

16. The method of claim 13, further comprising removing a portion of the etch stop layer.

17. The method of claim 16, wherein the removed portion of the etch stop layer has a tapered width such that the bottom of the removed portion has a width substantially equal to the second width.

18. The method of claim 16, further comprising introducing a conductive material into the removed portion of the etch stop layer.

19. A method of forming an integrated circuit having produced charge gain and loss, the method comprising:

depositing a first insulating layer over a semiconductor substrate including first and second gate structures, each of the gate structures including a control gate and a floating gate;

depositing an etch stop layer above the first insulating layer;

depositing a second insulating layer above the etch stop layer;

removing a portion of the second insulating layer between the first and second gate structures to form a first contact hole, the first contact hole extending to the top of the etch stop layer and having a first width;

removing a portion of the etch stop layer;

removing a portion of the first insulating layer between the first and second gate structures and below the first contact hole to form a second contact hole, the second contact hole extending between the bottom of the etch stop layer and the substrate and having a second width, the entire second width being less than the first width; and introducing a conductive material into the first and second contact holes to form a contact;

wherein the removed portion of the etch stop layer is located at substantially the same vertical position as the top of the floating gate.

20. A method of forming an integrated circuit having reduced charge gain and loss, the method comprising:

depositing a first insulating layer over a semiconductor substrate including first and second gate structures, each of the gate structures including a control gate and a floating gate;

depositing an etch stop layer above the first insulating layer;

depositing a second insulating layer above the etch stop layer;

removing a portion of the second insulating layer between the first and second gate structures to form a first contact hole, the first contact hole extending to the top of the etch stop layer and having a first width;

removing a portion of the etch stop layer;

removing a portion of the first insulating layer between the first and second gate structures and below the first contact hole to form a second contact hole, the second contact hole extending between the bottom of the etch stop layer and the substrate and having a second width, the entire second width being less than the first width; and introducing a conductive material into the first and second contact holes to form a contact;

wherein the removed portion of the etch stop layer is located at a vertical position above the vertical position of the top of the floating gate.

* * * * *